United States Patent [19]

Savkar et al.

[11] Patent Number: 5,225,372
[45] Date of Patent: Jul. 6, 1993

[54] METHOD OF MAKING A SEMICONDUCTOR DEVICE HAVING AN IMPROVED METALLIZATION STRUCTURE

[75] Inventors: Sunil W. Savkar; Edward O. Travis, both of Austin, Tex.

[73] Assignee: Motorola, Inc., Schaumburg, Ill.

[21] Appl. No.: 632,696

[22] Filed: Dec. 24, 1990

[51] Int. Cl.⁵ .............................................. H01L 21/44
[52] U.S. Cl. .................. 437/190; 437/192; 437/194; 437/200
[58] Field of Search ............... 437/190, 192, 194, 200; 228/179

[56] References Cited

U.S. PATENT DOCUMENTS

| | | | |
|---|---|---|---|
| 4,091,529 | 5/1978 | Zaleckas | 228/179 |
| 4,152,824 | 5/1979 | Gonsiorawski | 29/572 |
| 4,184,909 | 1/1980 | Chang et al. | 437/190 |
| 4,355,456 | 10/1982 | Harnagel et al. | 437/190 |
| 4,684,547 | 8/1987 | Di Stefano et al. | 156/632 |
| 4,822,753 | 4/1989 | Pintchovski | 437/192 |
| 4,829,024 | 5/1989 | Klein et al. | 437/192 |
| 4,882,293 | 11/1989 | Naumann et al. | 437/190 |
| 4,884,123 | 11/1989 | Dixit et al. | 437/194 |
| 5,008,216 | 4/1991 | Huang et al. | 437/192 |

FOREIGN PATENT DOCUMENTS

| | | |
|---|---|---|
| 0267730 | 5/1988 | European Pat. Off. . |
| 0309274 | 3/1989 | European Pat. Off. ... 148/DIG. 105 |
| 55-138257 | 10/1980 | Japan . |
| 55-138260 | 10/1980 | Japan . |
| 57-208161 | 12/1982 | Japan . |

OTHER PUBLICATIONS

M. A. Nicolet, "Diffusion Barriers in Thin Films", *Thin Solid Films*, vol. 52, 1978 pp. 431-436.

*Primary Examiner*—Brian E. Hearn
*Assistant Examiner*—Laura M. Holtzman
*Attorney, Agent, or Firm*—Jasper W. Dockrey

[57] ABSTRACT

An improved semiconductor device interconnect comprising a conductive layer (30) with an underlying diffusion barrier metal (26) is attached to a doped glass layer (20) by an intermediate metal adhesion layer (22). The metal adhesion layer (22) is deposited onto the doped glass layer (30) prior to the formation of contact openings (24) in the doped glass layer (30) and the subsequent formation of the interconnect metallization. In one embodiment, a titanium diffusion barrier (26) is deposited onto a doped glass layer (30) having an aluminum metal adhesion layer (22) thereon and contact openings (24) therethrough. The titanium is annealed to form a silicide (28) in a substrate region (14) exposed by the contact opening (24) and an aluminum interconnect (32) is formed contacting the silicide region (28).

3 Claims, 2 Drawing Sheets

METHOD OF MAKING A SEMICONDUCTOR DEVICE HAVING AN IMPROVED METALLIZATION STRUCTURE

FIELD OF THE INVENTION

This invention relates generally to semiconductor devices and to a method of fabrication, and more specifically to an improved interconnect metallization structure and process suitable for use in small geometry semiconductor devices.

BACKGROUND OF THE INVENTION

The semiconductor industry is characterized by a trend toward fabricating larger and more complex functions on a given semiconductor chip. The larger and more complex functions are achieved by reducing device sizes and spacing and by reducing the junction depth of regions formed in the semiconductor substrate. Among the feature sizes which are reduced in size are the width and spacing of interconnecting metal lines and the contact openings through which the metallization makes electrical contact to active device regions. As the feature sizes are reduced, new problems arise which must be solved in order to economically and reliably produce the semiconductor devices.

As both the contact size and junction depth are reduced, a new device metallization process is required to overcome the problems which are encountered. Historically, device interconnections have been made with aluminum or aluminum alloy metallization. Aluminum, however, presents problems with junction spiking which result from dissolution of silicon in the aluminum metallization and aluminum in the silicon. This problem is exacerbated with the small device sizes because the shallow junction is easily shorted and because the amount of silicon available to satisfy the solubility requirements of the aluminum metallization is only accessed through the small contact area, increasing the resultant depth of the spike. Adding silicon to the aluminum metallization has helped to solve this problem, but has, in turn, resulted in silicon precipitation and other problems.

One solution to this problem is to form a silicon diffusion barrier between the silicon substrate and the aluminum metallization. A conductive material such as titanium is deposited into the contact and annealed in a nitrogen ambient to form both a reactive silicide which directly contacts the device region and titanium nitride. An aluminum interconnect is then formed to contact the titanium nitride and the reactive silicide without direct contact by the aluminum to the active device region and without silicon precipitation in the contact. The formation of the titanium diffusion barrier in the contact requires that a layer of titanium be deposited on the surface of the insulating layers which overlie the active device region and through which the contacts are formed. Typically, the insulating layers include a doped glass layer which is applied to the substrate and annealed to form a planar surface prior to forming the interconnect metallization. A doped glass layer is preferred because the dopant causes the glass to flow at a sufficiently low temperature such that the previously formed shallow junctions will not be diffused further into the substrate.

The diffusion barrier metal must adhere well to the doped glass layer if the device metallization is to hold together when the individual die are separated from each other prior to packaging. During the process of die separation severe shear stress occurs which can result in the metal lifting from the die. Additionally, the interconnect metallization is stressed by compressive and pulling forces when package leads are bonded to the metal interconnects. In extreme cases the portion of the metal interconnect at the bond site is completely torn away from the die. Given that barrier metals comprising titanium and titanium alloys do not adhere well to doped glass, the increased use of barrier metals in advanced semiconductor devices has been accompanied by an increase in metal lifting and bonding failure.

BRIEF SUMMARY OF THE INVENTION

In practicing the present invention there is provided a semiconductor device having an improved metallization structure and a method for fabricating the device. The integrity of a device metallization structure is improved by the application of the metal adhesion layer over a doped glass layer prior to the deposition of a diffusion barrier metal. In one embodiment, a silicon substrate having an active device region is provided. A doped glass layer having a principle surface and contact openings therethrough exposing selected portions of the active region overlies the substrate. The contact openings having a wall surface extending from the principle surface to the substrate. A metal adhesion layer overlies the principle surface of the doped glass layer. A diffusion barrier metal directly overlies the adhesion layer and the wall surface of the contact openings and contacts the exposed portion of the active region. A silicide region is formed in the exposed portion of the substrate by reacting the diffusion barrier metal with the silicon substrate.

Figure 1:
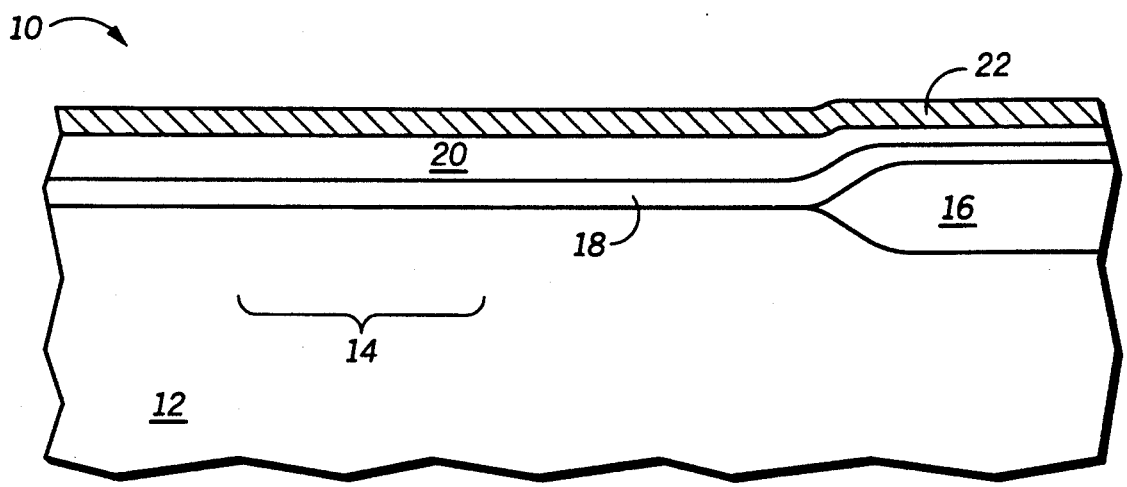
FIGS. 1-3 illustrate, in cross section, process steps in accordance with the invention.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE INVENTION

The metallization structure of the present invention provides improved adhesion of a metal interconnect having an underlying diffusion barrier metal to a doped glass insulator such as PSG, BPSG and the like. Increased adhesion is provided by the formation of a metal adhesion layer intermediate to the diffusion barrier metal and the doped glass layer. The diffusion barrier metal contacts portions of a silicon substrate exposed by contact openings formed in the doped glass layer. An important feature of the present invention is that the metal adhesion layer is not present in the metallurgy formed within the contact opening at the silicon substrate. The application of the metal adhesion layer away from the electrically active contact region avoids the necessity that the metal adhesion be an electrically conductive material, thus the metal adhesion layer can be formed from a variety of materials including both electrically conductive materials and electrically insulating materials. Improved device reliability is realized by reducing metal lifting during device fabrication operations such as die separation and package lead bonding. Although the invention will be described with respect to an MOS device, it is to be understood that other types of semiconductor devices such as bipolar, BiCMOS and discrete devices and the like can also employ the present invention and realize the same advantages described herein.

Shown in FIG. 1, a portion of a semiconductor device 10 having a substrate 12 including an active device region 14 and an isolation region 16 formed therein. Active region 14 is doped with a conductivity determining impurity to make active region 14 either an N-type or P-type region. For purposes of illustrating the invention, substrate 12 is a monocrystalline silicon substrate and active region 14 is formed at the surface of substrate 12 by diffusion, ion implantation, or the like. Active region 14 can be one of many device regions formed in the totality of a semiconductor device with the exact number, pattern, and distribution of such regions being determined by the function implemented by the semiconductor device. For example, active region 14 can be a source-drain region for an MOS transistor or a doped well region or the like. Isolation region 16 can be a thick field oxide layer formed by local-oxidation-of-silicon (LOCOS), or another type of conventional electrical isolation structure such as a trench isolation structure. In a typical layered insulation structure for an MOS device, a dielectric layer 18 and a doped glass layer 20 overlie substrate 12. Dielectric layer 18 can be a silicon oxide deposited at low temperature (LTO) or another dielectric material such as silicon oxide formed by CVD using tetraethoxysilane (TEOS) source gas, and the like. Doped glass layer 20 is preferably BPSG, or alternatively, layers 18 and 20 can be a single doped glass layer such as PSG or BSG. Following deposition, doped glass layer 20 is annealed to flow the glass over the surface of substrate 12 and form a smooth planar surface.

In a conventional device, following the formation of contact holes and a glass reflow, a diffusion barrier metal is formed by, for example, depositing a layer of titanium (Ti) directly onto the doped glass layer and annealing in a nitrogen containing ambient to form titanium nitride (TiN). The Ti/TiN layer contacts the silicon substrate through contact openings in the doped glass layer and prevents the diffusion of silicon out of the substrate and into a a metal interconnect overlying the Ti/TiN layer. As described previously, this structure does not provide good adherence of an overlying barrier metal layer such as Ti to the doped glass layer. To avoid this problem and obtain a highly reliable device, the present invention employs a metal adhesion layer 22 overlying doped glass layer 20 to provide an adhesive surface for bonding a diffusion barrier metal to doped glass layer 20. Adhesion layer 22 is preferably Al sputter deposited to a thickness of about 20 to 200 nanometers. Alternatively, adhesion layer 22 can be titanium nitride TiN formed by reactive ion sputtering (RIS) or chemical vapor deposition (CVD), or titanium oxide (TiO$_2$) formed by annealing Ti in an oxygen containing ambient. Furthermore, in one embodiment, adhesion layer 22 is titanium aluminide (TiAl$_3$) formed by the reaction of a sputtered Al layer with an overlying Ti barrier metal. Prior to the deposition of adhesion layer 22, an optional cleaning step can be carrier out by RF sputtering, or alternatively, hydrofluoric acid etching to remove several monolayers from the surface of doped glass layer 20.

Figure 2:
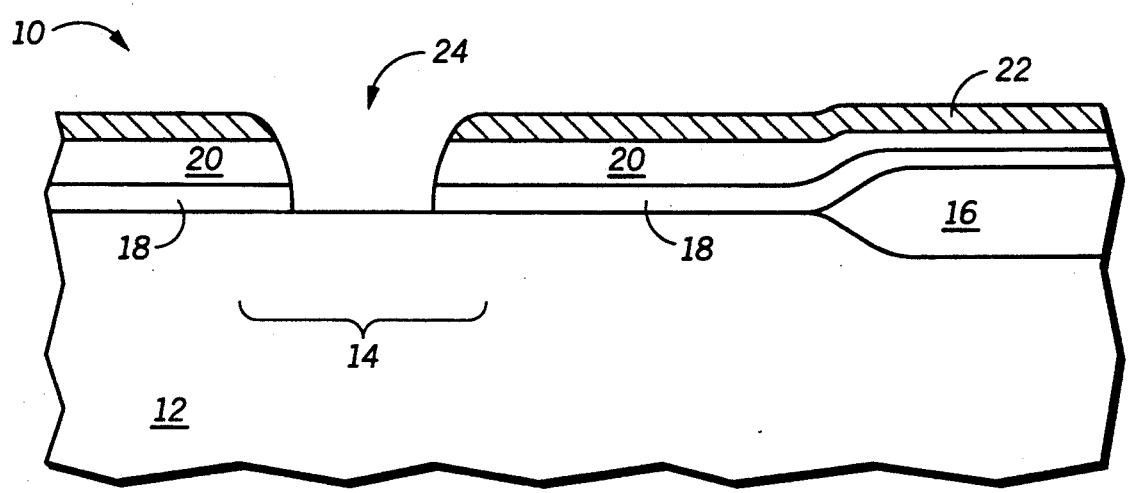

Next, a contact opening 24 is formed in the layers overlying substrate 12 to expose a portion of active region 14, as shown in FIG. 2. Contact opening 24 is formed by photolithographically patterning adhesion layer 22 and etching adhesion layer 22, doped glass layer 20 and dielectric layer 18. The contact etch can be carried out by first reactive-ion-etching (RIE) adhesion layer 22 with chlorine based gases followed by etching doped glass layer 20 and dielectric layer 18 with fluorine based gases. For example, the contact etch can be accomplished by RIE etching adhesion layer 22 in Cl$_2$ and BCl$_3$ followed by etching doped glass layer 20 and dielectric layer 18 in CHF$_3$ and oxygen. Alternatively, a contact etch process which includes an isotropic etch followed by an anisotropic, RIE etch can be used. The isotropic etch forms a sloping wall profile at the top of the contact while the anisotropic etch forms a substantially vertical wall profile near the surface of substrate 12. The isotropic etch can be carried out for example, by a wet chemical etch or alternatively, by a dry isotropic etch.

Figure 3:
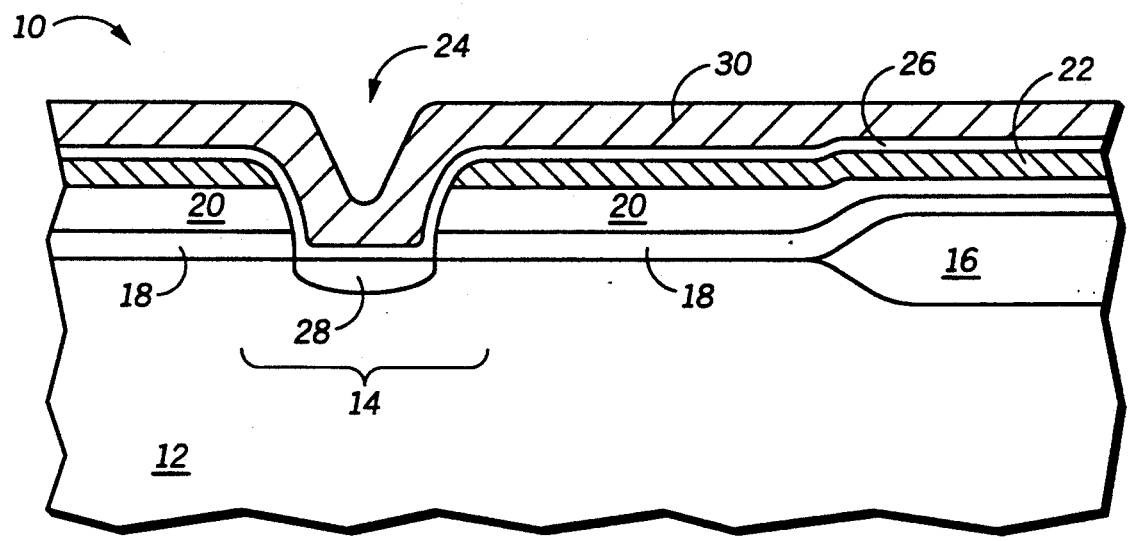

As illustrated in FIG. 3, in accordance with a preferred embodiment of the invention, the process continues with the deposition of a diffusion barrier metal 26 over the surface of adhesion layer 22 and extending into contact opening 24 to contact the exposed portion of device region 14. The diffusion barrier preferably has a thickness of 10-100 nanometers and functions to prevent silicon from substrate 12 from diffusing into an overlying metal interconnect and increasing the electrical resistance in the contact. The diffusion barrier metal is preferably a Ti/TiN composite however, other refractory metals such as pure Ti, platinum (Pt), niobium (Nb) and the like, and intermetallic alloys of W, Pt and Co such as TiW can also be used. Alternatively, diffusion barrier metal 26 can be a composite material formed by RF sputter deposition of Ti followed by reactive ion sputtering or CVD deposition of TiN.

In one embodiment wherein diffusion barrier metal 26 is a layer of titanium, the process is continued by heating the structure in a nitrogen ambient to cause both the formation of titanium silicide 28 at the Ti-silicon interface and the formation of TiN (not shown). This is accomplished, for example, by heating the structure in nitrogen or a nitrogen containing ambient such as ammonia at about 650° to 800° C. for about 15 to 20 seconds. During the heat treatment, the nitrogen reacts with the titanium to form a layer of TiN. The original central portion of the titanium either remains as pure titanium or becomes a ternary silicide of composition TiN$_x$Si$_y$ (not shown) depending on the thickness of the titanium and the length of the anneal cycle. In the case where adhesion layer 22 is Al, a portion of the Al is converted to TiAl$_3$. Furthermore, in cases where adhesion layer 22 is very thin, for example 20-50 nanometers, adhesion layer 22 is completely converted to TiAl$_3$.

As further illustrated in FIG. 3, a metal interconnect layer 30 of electrically conductive material is deposited to provide an interconnect metallization overlying barrier metal 26. It is necessary to have a highly conductive film interconnecting device regions and providing electrical interconnection between device regions and bonding pads which are usually located on the periphery of the chip. The interconnect metallization must be amenable to patterning into narrow, closely spaced lines. The metallization must also be sufficiently malleable to allow wire bonds to be attached at the bonding pads. It is desirable to use aluminum or an alloy of aluminum (hereafter referred to collectively as aluminum) as the interconnect metallization. However, another conductive material such as a refractory metal or a refractory metal alloy can also be used. Preferably, interconnect layer 30 comprises a layer of aluminum sputter deposited to overlie barrier metal 26 and extending into contact opening 24 forming an ohmic electrical contact to silicide region 28. The aluminum is deposited to a sufficient thickness to insure that a low resistivity electrical interconnect wiring is formed.

It is to be noted that the metallization structure described above illustrates, in a preferred embodiment, one form of a barrier metal and interconnect metallization structure having an underlying adhesive layer for promoting the adhesion of the metallization structure to a doped glass layer. A number of other materials can be used which differ from this preferred embodiment and yet still fall within scope of the invention. For example, although a Ti/TiN composite is the preferred contact metallization, other barrier metals and interconnect metals can realize the adhesion improvement provided by the present invention. In accordance with the invention, the other materials must be reactive enough to reduce any native oxide formed on the surface of the device region 14 to insure a low resistance electrical contact thereto. Other suitable materials include, for example, molybdenum (Mo). The preferred interconnect metallization includes alloys of Al with small amounts of silicon, copper (Cu), and the like. Other interconnect metals include, for example, Cu and alloys of Cu. Each of these variations provide a device metallization and can be used in the fabrication of semiconductor devices in accordance with the invention.

Following the formation of metal interconnects and application of a passivation layer having bond pad openings therein, the individual die are separated from each other in preparation for placement in a package. Typically, a silicon saw is used to separate the die along scribe lines formed in the silicon substrate. The sawing process places substrate 12 under considerable tension from sheer stress which can cause layers overlying substrate 12 to separate from each other resulting in device failure. During the sawing process, adhesion layer 22 prevents metal interconnect layer 30 from peeling away from doped glass layer 20. Thus, a further advantage of the invention is an improvement in die yield during the die separation process.

Figure 4:
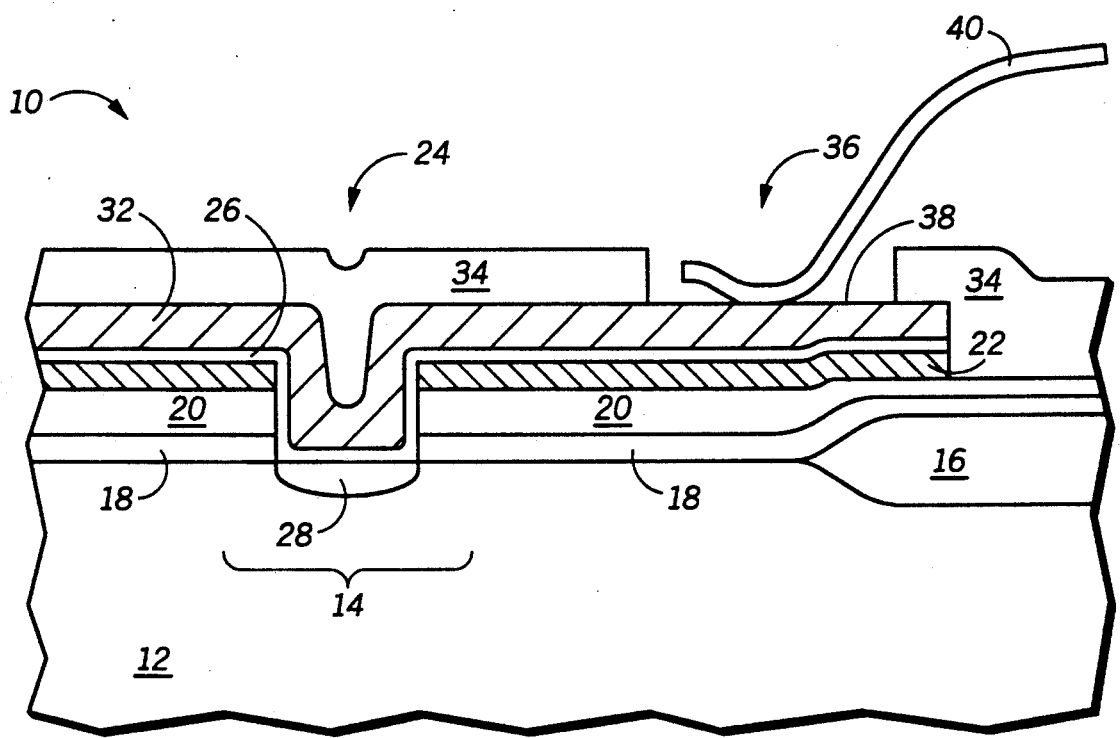
FIG. 4 illustrates, in cross section, a metal interconnect and bond pad structure formed in accordance with the invention.

In another aspect, the present invention also provides an improved bond pad structure by reducing metal lifting during bonding operations when wire bonds or tape-automated bonding (TAB) bonds and the like are made to electrically connect semiconductor device 10 to package leads. One example of a metal interconnect and associated bond pad structure is shown in FIG. 4. Layer 30 is photolithographically patterned and etched with the underlying diffusion barrier metal 26 and metal adhesion layer 22 to form a patterned metal interconnect 32 configured for the device function being implemented. The Al metallization, the remaining TiN and Ti underlying the Al and the metal adhesion layer are patterned in a single photolithographic patterning step. The TiN and Ti are etched by the same etchant as is used for the Al and adhesion layer 22. Then, a passivation layer 34, which can be CVD deposited silicon oxide or PECVD deposited silicon nitride, is formed over the surface of metal interconnect 32 and remaining semiconductor device 10. The bonding pad structure is completed by photolithographically patterning and etching passivation layer 34 to form a bond pad opening 36 exposing a bonding portion 38 of metal interconnect 32.

Once the bond pad structure is formed, a package lead 40 is bonded to bonding portion 38. For purposes of illustration, a wire bonded lead preferably comprised of Al or gold (Au) is shown in FIG. 4, however, a TAB bonded lead can also be used. In the case of wire bonding, package lead 40 is attached to bonding portion 38 by stitch bonding. Alternatively, any one of ultrasonic bonding, thermocompression bonding and thermosonic bonding can also be used. All the foregoing bonding methods bring package lead 40 into contact with bonding portion 38 followed by the application of compressive force or a combination of compressive force and either ultrasonic vibration or heat to form a eutectic bond. When the bonding tool holding package lead 40 is drawn away from the bond site a pulling force is exerted on the bond pad structure. Adhesion layer 22 resists the mechanical forces applied during the bonding operation and holds metal interconnect 32 and the underlying barrier metal 26 to doped glass layer 20.

Thus it is apparent that there has been provided, in accordance with the invention, a semiconductor device having a metal adhesion layer which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the contact metallization can form an electrical contact to a gate electrode comprised of a doped semiconductor material wherein a silicide contact region is formed in the gate electrode. Furthermore, the adhesion layer can be applied to multi-level metal structures where a Ti metal layer is deposited to reduce electromigration in an overlying Al layer. It is therefore intended to include within the invention all such variations and modifications as fall within the scope of the appended claims and equivalents thereof.

We claim:

1. A method for fabricating a semiconductor device comprising:
   providing a silicon substrate having a surface;
   forming an active region at the surface;
   forming a doped glass layer overlying the active region;
   depositing a layer of aluminum onto the doped glass layer;
   etching the aluminum layer and the underlying doped glass layer to form a contact opening therein exposing a portion of the active region while leaving unetched portions of the aluminum layer overlying the doped glass layer;
   forming a titanium barrier metal layer overlying the exposed portion of the active region and the unetched portions of the aluminum layer;
   annealing the titanium layer to form a silicide region in the exposed portion, and to selectively form a titanium aluminide adhesion layer intermediate to the titanium layer and the doped glass layer; and forming a metal interconnect layer overlying the titanium barrier metal layer and making electrical contact to the silicide region.

2. The method of claim 1 wherein the step of forming a doped glass layer comprises depositing a silicon oxide layer doped with one of phosphorus, boron or a combination thereof.

3. The method of claim 1 wherein forming a metal interconnect comprises:

depositing an Al interconnect layer onto the titanium barrier metal;

forming a photoresist pattern overlying the Al interconnect layer; and sequentially etching the Al interconnect layer, the titanium barrier metal and the aluminum layer.

* * * * *